(12) United States Patent
Morris, III

(10) Patent No.: US 9,871,502 B2
(45) Date of Patent: Jan. 16, 2018

(54) MIXED-TECHNOLOGY COMBINATION OF PROGRAMMABLE ELEMENTS

(71) Applicant: Wispry, Inc., Irvine, CA (US)

(72) Inventor: Arthur S. Morris, III, Raleigh, NC (US)

(73) Assignee: WISPRY, INC., Irvine, CA (US)

( * ) Notice: Subject to any disclaimer, the term of this patent is extended or adjusted under 35 U.S.C. 154(b) by 0 days.

(21) Appl. No.: 15/212,094

(22) Filed: Jul. 15, 2016

(65) Prior Publication Data

US 2017/0134008 A1    May 11, 2017

Related U.S. Application Data

(63) Continuation of application No. 13/873,964, filed on Apr. 30, 2013, now Pat. No. 9,413,337.
(Continued)

(51) Int. Cl.
*H03J 3/20*    (2006.01)
*H03J 5/24*    (2006.01)
(Continued)

(52) U.S. Cl.
CPC ............ *H03J 5/0209* (2013.01); *B81B 7/008* (2013.01); *B81C 1/00238* (2013.01);
(Continued)

(58) Field of Classification Search
CPC ... H03J 5/00; H03J 5/02; H03J 5/0209; H01L 23/52; H01L 23/522; H01L 23/5221;
(Continued)

(56) References Cited

U.S. PATENT DOCUMENTS 7,155,182 B2 * 12/2006 Eckl ................... H03F 3/195
331/177 V
7,180,145 B2    2/2007 Musalem
(Continued)

FOREIGN PATENT DOCUMENTS

CN        1338119 A     2/2002
EP     1 703 634 A1    9/2006
(Continued)

OTHER PUBLICATIONS

International Search Report and Written Opinion for Application No. PCT/US2013/038853 dated Sep. 25, 2013.
(Continued)

*Primary Examiner* — Lincoln Donovan
*Assistant Examiner* — Diana J Cheng
(74) *Attorney, Agent, or Firm* — Jenkins, Wilson, Taylor & Hunt, P.A.

(57) ABSTRACT

The present subject matter relates to systems and methods for arranging and controlling programmable combinations of tuning elements in which more than one form of switching technology is combined in a single array. Specifically, such an array can include one or more first switchable elements including a first switching technology (e.g., one or more solid-state-controlled devices) and one or more second switchable elements including a second switching technology that is different than the first switching technology (e.g., one or more micro-electro-mechanical capacitors). The one or more first switchable elements and the one or more second switchable elements can be configured, however, to deliver a combined variable reactance.

20 Claims, 3 Drawing Sheets

Related U.S. Application Data

(60) Provisional application No. 61/640,556, filed on Apr. 30, 2012.

(51) Int. Cl.

| | | |
|---|---|---|
| *H03J 5/02* | (2006.01) | |
| *B81B 7/00* | (2006.01) | |
| *B81C 1/00* | (2006.01) | |
| *H01L 27/06* | (2006.01) | |
| *H01L 23/522* | (2006.01) | |
| *H01L 49/02* | (2006.01) | |

(52) U.S. Cl.
CPC ...... *H01L 23/5223* (2013.01); *H01L 27/0688* (2013.01); *H01L 28/40* (2013.01); *B81B 2201/01* (2013.01); *B81B 2207/053* (2013.01); *B81C 2203/0785* (2013.01)

(58) Field of Classification Search
CPC .......... H01L 23/5222; H01L 23/5223; H01L 23/5225; H03H 7/0161; H03H 7/12; H03H 7/0115; H03H 7/1775; H03H 7/0153
USPC .................. 334/47, 55; 333/167, 174–176
See application file for complete search history.

(56) References Cited

U.S. PATENT DOCUMENTS

| | | | |
|---|---|---|---|
| 7,361,962 | B2 | 4/2008 | Plowman |
| 7,388,316 | B2 | 6/2008 | Musalem |
| 7,586,164 | B2 | 9/2009 | Musalem |
| 8,416,008 | B2 | 4/2013 | Van Zyl |
| 9,413,337 | B2 | 8/2016 | Morris |
| 2001/0013632 | A1 | 8/2001 | Richiuso |
| 2009/0156137 | A1 | 6/2009 | Rofougaran et al. |
| 2010/0039194 | A1 | 2/2010 | Darabi et al. |
| 2010/0225419 | A1 | 9/2010 | Pan et al. |
| 2012/0007215 | A1 | 1/2012 | Darabi et al. |
| 2013/0314175 | A1 | 11/2013 | Morris, III |

FOREIGN PATENT DOCUMENTS

| | | |
|---|---|---|
| EP | 2 845 232 | 3/2015 |
| WO | WO 2008/087583 A2 | 7/2008 |
| WO | WO 2009/108391 A1 | 9/2009 |
| WO | WO 2013/166008 | 11/2013 |

OTHER PUBLICATIONS

International Preliminary Report on Patentability and Written Opinion for Application No. PCT/US2013/038853 dated Nov. 13, 2014.
Non-Final Office Action for U.S. Appl. No. 13/873,964 dated Dec. 26, 2014.
Final Office Action for U.S. Appl. No. 13/873,964 dated Jun. 5, 2015.
Non-Final Office Action for U.S. Appl. No. 13/873,964 dated Oct. 23, 2015.
European Search Report for Application No. 13 785 065.7 dated Feb. 9, 2016.
Notice of Allowance for U.S. Appl. No. 13/873,964 dated Mar. 29, 2016.
Notice of Allowance for U.S. Appl. No. 13/873,964 dated May 19, 2016.
European Notice of Publication for Application No. 13785065 dated Feb. 11, 2015.
Chinese Search Report for Application No. 201380034878 dated Aug. 23, 2016.
Chinese Office Action for Application No. 201380034878 dated Sep. 1, 2016.

\* cited by examiner

MIXED-TECHNOLOGY COMBINATION OF PROGRAMMABLE ELEMENTS

PRIORITY CLAIM

The present application is a continuation of and claims priority to U.S. patent application Ser. No. 13/873,964, filed Apr. 30, 2013, which claims the benefit of U.S. Provisional Patent Application Ser. No. 61/640,556, filed Apr. 30, 2012, the disclosures of which are incorporated herein by reference in their entireties.

TECHNICAL FIELD

The subject matter disclosed herein relates generally to tunable electrical and electronic apparatuses and related methods. More particularly, the subject matter disclosed herein relates to systems and methods for arranging and controlling programmable combinations of tuning elements.

BACKGROUND

To achieve a variably controllable reactance (e.g., capacitance) for an electronic device, arrays of switched elements have been combined into banks to provide a summed programmable reactance. To date, these arrays have been implemented with a single switching technology and device design. This uniformity simplifies the technology development and is a good solution for many applications, but in some applications, such as tunable filters in particular, large tuning ranges are desirable in combination with fine tuning resolution. Achieving both of these results with a single design can require that the devices each provide only a very small reactance shift. To make such a configuration cost-effective for substantial total reactance, the devices would necessarily need to be physically very small. Each device has overhead area driven by the design rules of the process, however, and thus the total array size would increase for a given total tuning range. In addition, the added interconnect area would also increase parasitics and lower overall ratio, and power handling often does not scale well with size. As a result, large arrays of very small devices may not be a practical solution.

One alternative can be to scale only a subset of devices in the array to provide fine tuning. When using an array of micro-electro-mechanical systems (MEMS) capacitors, for example, this configuration could provide a high performance solution, but such an arrangement would not be area efficient, as all capacitor bit values would have generally the same physical size. Even if the subset of devices were made physically smaller, having different MEMS mechanics makes achieving high process yield much more difficult.

As a result, it would be desirable for a configuration of an array of switched capacitors to provide a large tuning range in combination with a fine tuning resolution and to maintain high Q and/or linearity in the majority of the reactance, while avoiding the drawbacks of previous arrays configured to achieve such performance criteria.

SUMMARY

In accordance with this disclosure, systems and methods for arranging and controlling a programmable combination of tuning elements are provided. In one aspect, a combination of tuning elements comprising more than one form of switching technology combined in a single array is provided. Specifically, such an array can comprise one or more first switchable elements comprising a first switching technology (e.g., one or more solid-state-controlled devices) and one or more second switchable elements comprising a second switching technology that is different than the first switching technology (e.g., one or more micro-electro-mechanical capacitors). The one or more first switchable elements and the one or more second switchable elements can be configured, however, to deliver a combined variable reactance.

In another aspect, a method for producing a programmable combination of tuning elements can comprise producing one or more first switchable elements comprising a first switching technology and mounting one or more second switchable elements on top of, below, or beside the one or more first switchable elements. Again, the one or more second switchable elements comprising a second switching technology that is different than the first switching technology, and the one or more first switchable elements and the one or more second switchable elements are configured to deliver a combined variable reactance.

In yet another aspect, a method for producing a programmable combination of tuning elements can comprise producing one or more first switchable elements comprising a first switching technology and one or more second switchable elements comprising a second switching technology in a single monolithic semiconductor die. As noted above, the second switching technology can be different than the first switching technology, and the one or more first switchable elements and the one or more second switchable elements are configured to deliver a combined variable reactance.

Although some of the aspects of the subject matter disclosed herein have been stated hereinabove, and which are achieved in whole or in part by the presently disclosed subject matter, other aspects will become evident as the description proceeds when taken in connection with the accompanying drawings as best described hereinbelow.

BRIEF DESCRIPTION OF THE DRAWINGS

The features and advantages of the present subject matter will be more readily understood from the following detailed description which should be read in conjunction with the accompanying drawings that are given merely by way of explanatory and non-limiting example, and in which.

DETAILED DESCRIPTION

Figure 1:
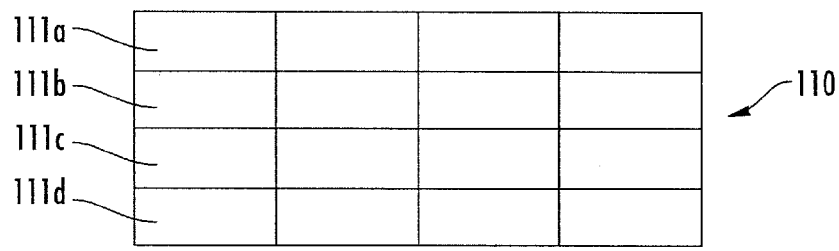
FIG. 1 is a plan view of a single-switching-technology capacitor sub-array according to an embodiment of the presently disclosed subject matter.

Reference will now be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures is turned over, structure or portion described as "above" other structures or portions would now be oriented "below" the other structures or portions. Likewise, if devices in the figures are rotated along an axis, structure or portion described as "above", other structures or portions would now be oriented "next to" or "left of" the other structures or portions. Like numbers refer to like elements throughout.

The present subject matter provides systems and methods for arranging and controlling programmable combinations of individual tuning elements. In particular, the present subject matter provides an array of tuning elements composed of more than one switching technology combined in a single array. A portion of the programmable reactance (e.g., capacitance) can be implemented in a first sub-array 110 comprising elements of a first switching technology. For example, first sub-array 110 can comprise a first number n of MEMS capacitors 111 (n≥1), which can advantageously provide for high ratio, Q, linearity, and voltage handling. Each of MEMS capacitors 111 can comprise MEMS variable capacitors, for example, in which at least a first capacitive electrode is movable with respect to a second capacitive electrode (e.g., upon application of a voltage to associated actuation electrodes) to change a capacitance between the first and second capacitive electrodes (e.g., between a minimum capacitance value and a maximum capacitance value). Some particular examples of MEMS variable capacitors can be found in U.S. Pat. Nos. 7,180,145, 7,361,962, 7,388,316, and 7,586,164, the disclosures of which are incorporated by reference herein in their entirety.

For example, as shown in FIG. 1, first sub-array 110 can comprise a 4×4 array of 16 MEMS capacitors 111 (i.e., a first MEMS capacitor 111a, a second MEMS capacitor 111b, etc., up to an nth MEMS capacitor 111n). In this configuration, the resolution of the array can be substantially equal to the available capacitance change (e.g., capacitance change from min to max) provided by each of MEMS capacitors 111 (e.g., about 250 fF each for a total tuning range of 4 pF). Of course, other array sizes, configurations, and individual element capacitances are contemplated by the present subject-matter.

If first sub-array 110 was used alone to provide the entire summed programmable capacitance (e.g., as in a single-switching-technology array discussed above), finer resolution could be achieved by configuring one or more of MEMS capacitors 111 to provide a capacitance change of less than the standard capacitance range of the remaining elements. For example, where MEMS capacitors 111 can be generally configured to have a capacitance range of about 250 fF, one of MEMS capacitors 111 (e.g., first MEMS capacitor 111a) can be scaled to provide only 125 fF capacitance range. In this way, the total tuning range of first sub-array 110 would be reduced to 3.875 pF, but a corresponding refinement in the resolution to 125 fF can be achieved within that tuning range. This configuration can work well for many current applications. For example, 125 fF can be sufficient resolution for some impedance tuner applications.

Taken further, however, this approach does not scale well to applications requiring even finer resolution, as it can require the use of a full-size MEMS beam for each bit added. For instance, if three more of MEMS capacitors 111 were to be replaced with devices having relatively decreasing capacitance change values, three more binary bits of resolution can be added. In one specific configuration, for example, second MEMS capacitor 111b can be configured to have a capacitance change of about 63 fF, a third MEMS capacitor 111c can be configured to have a capacitance change of about 32 fF, and a fourth MEMS capacitor 111d can be configured to have a capacitance change of about 16 fF.

In this configuration, a resolution of about 16 fF can be achieved, but such a modification from a uniform array would result in the total array capacitance dropping from 4 pF to 3.234 pF. Thus, whereas giving up one capacitor slot for one more bit of resolution costs only a marginal loss in total tuning range, further improving the resolution of the array more seriously impacts the performance of the system. This compromise may be acceptable for some low-tuning-range filters and antennas, but such a solution constrains the possible applications. As further discussed above, another drawback to this approach is that while some of the capacitor parasitics scale with the bit scaling, others will remain constant, leading to a reduced effective ratio between tuning range and parasitics.

Accordingly, rather than adjusting the resolution of first sub-array 110 by varying the individual capacitance range of one or more of MEMS capacitors 111, first sub-array 110 can be used in parallel with a second sub-array 120 that is configured to provide fine tuning below the resolution of first sub-array 110. Specifically, for example, where first sub-array 110 comprises capacitive elements of a first switching technology (e.g., MEMS capacitors 111), second sub-array 120 can comprise elements of a second switching technology that is different from the first switching technology. In particular, second sub-array 120 can comprise solid-state-controlled elements 121 (e.g., variable or switched elements). Second sub-array 120 can comprise analog devices, but further advantages can be realized where second sub-array 120 comprises a switched-capacitor array using switches.

Figure 2:
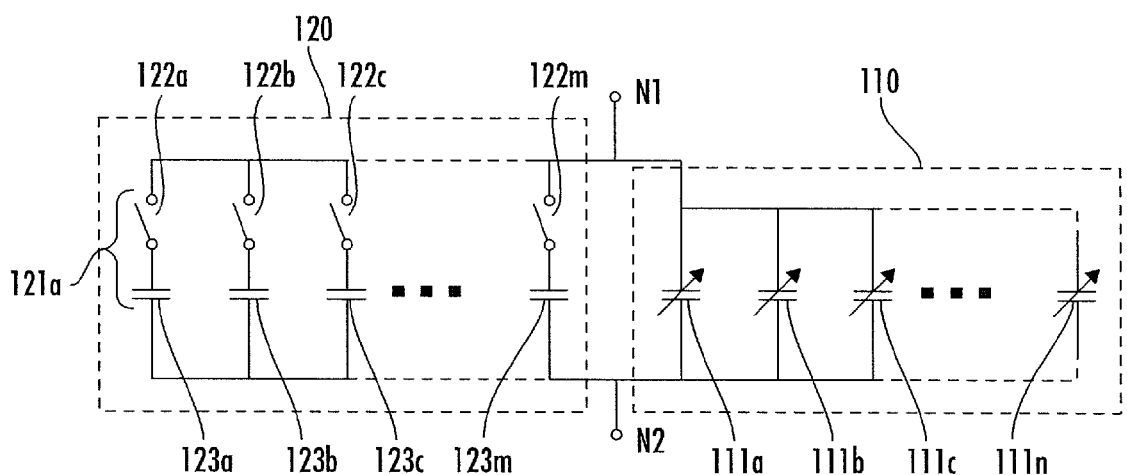
FIG. 2 is a schematic diagram of a mixed-technology capacitor array according to an embodiment of the presently disclosed subject matter.

In particular, referring to an exemplary configuration shown in FIG. 2, second sub-array 120 can comprise a second number m of solid-state controlled elements 121 (e.g., a first solid-state controlled element 121a, a second solid-state controlled element 121b, etc., up to an mth solid-state controlled element 121m, wherein m≥1). In the configuration shown in FIG. 2, each of solid-state controlled elements 121 can comprise a solid-state switch 122 connected in series with a fixed capacitor 123. Each solid-state switch 122 can be constructed using silicon CMOS or NMOS on any substrate or base transistor technology (e.g., bulk, silicon on insulator (SOI), or silicon on sapphire (SOS)). Alternatively, each solid-state switch 122 can be provided using field-effect transistors (FET), high-electron-mobility transistors (HEMT), heterojunction bipolar transistors (HBT), or other switching configurations, which can be built using SiGe, GaAs, or any of a variety of other known compound semiconductors. In yet a further alternative, MEMS switches can be used in place of each solid-state switch 122 for controlling the activation of each fixed capacitor 123.

Each fixed capacitor 123 can be tightly integrated with a corresponding solid-state switch 122 to maintain a high Q value. Each fixed capacitor 123 can be a single- or multi-layer device and can comprise a metal-insulator-metal (MIM) construction, a multi-layer generalization of a MIM capacitor, an interdigitated (e.g., single-layer) construction, or a combination of capacitor construction designs. Although FIG. 2 shows first and second sub-arrays 110 and 120 comprising individual tuning elements being connected in parallel with each other, the specific arrangement of elements can be configured in various series-parallel combinations to achieve requirements related to loss, voltage handling, parasitics, and/or other performance characteristics.

Regardless of the particular configuration, the combination of first sub-array 110 and second sub-array 120 can be used to provide both a wide tuning range and fine tuning in a compact form factor and a common, well-scaled MEMS design, which can thereby allow the production of capacitor arrays that are more cost effective than conventional designs while still enabling very rapid fine tuning. For instance, each of solid-state controlled elements 121 can provide a capacitance tuning range less than a capacitance tuning range of each of MEMS capacitors 111 (e.g., less than or equal to about one-half (½) of the capacitance tuning range of each of MEMS capacitors 111). In particular, the solid-state controlled elements 121 can define a binary set of capacitances, wherein each capacitor i of second sub-array 120 can provides a capacitance tuning range of about $1/2^{i+1}$ of the capacitance tuning range of MEMS capacitors 111.

In one particular configuration, for example, each of MEMS capacitors 111 in first sub-array 110 can be configured to provide an element resolution of about 0.25 pF, whereas solid-state controlled elements 121 in second sub-array 120 can together supply 0.125 pF or more of fine resolution tuning. Specifically, second sub-array 120 can have solid-state controlled elements 121 with individual tuning ranges of 125 fF, 62 fF, 31 fF, 16 fF, 8 fF, etc. In fact, for the finest bits, the parasitics of the transistor may be sufficient.

In this way, a majority of the total capacitance range can be handled by first sub-array 110, which can be advantageous since switched-state MEMS capacitors can typically exhibit comparatively higher Q and series ratio for large capacitance values in a given chip, and they can further exhibit far higher linearity. With respect to second sub-array 120, some key issues regarding the use of solid-state capacitive tuners are low Q, linearity, and power handling in a cost-effective solution. Since the total tuning range of the elements in second sub-array 120 is comparatively small, however, solid-state controlled elements 121 can themselves be very small, and thus the degradation they bring can be minimized such that the overall system can still achieve a high final Q. Further in this regard, the small size of solid-state controlled elements 121 can allow for devices to be stacked achieve the required linearity and voltage handling. In addition, although the ratio of the solid-state devices is less than the MEMS, they can be connected in parallel with the high ratio MEMS as shown in FIG. 2, and thus the array can maintain a fairly high ratio as a whole. Such a configuration can also enable extremely long lifetimes and rapid switching for a subset of the capacitance. Specifically, because the solid-state devices can generally be much faster than the MEMS, fine trimming could occur very rapidly. Using solid-state devices for fine tuning and/or tracking can also relieve the MEMS capacitors from frequent cycling, thereby improving the lifetimes of the MEMS devices. As a result, by implementing multiple switching technologies simultaneously in a hybrid solution, the combined system can be able to bring the best features of each technology to bear.

Figure 3:
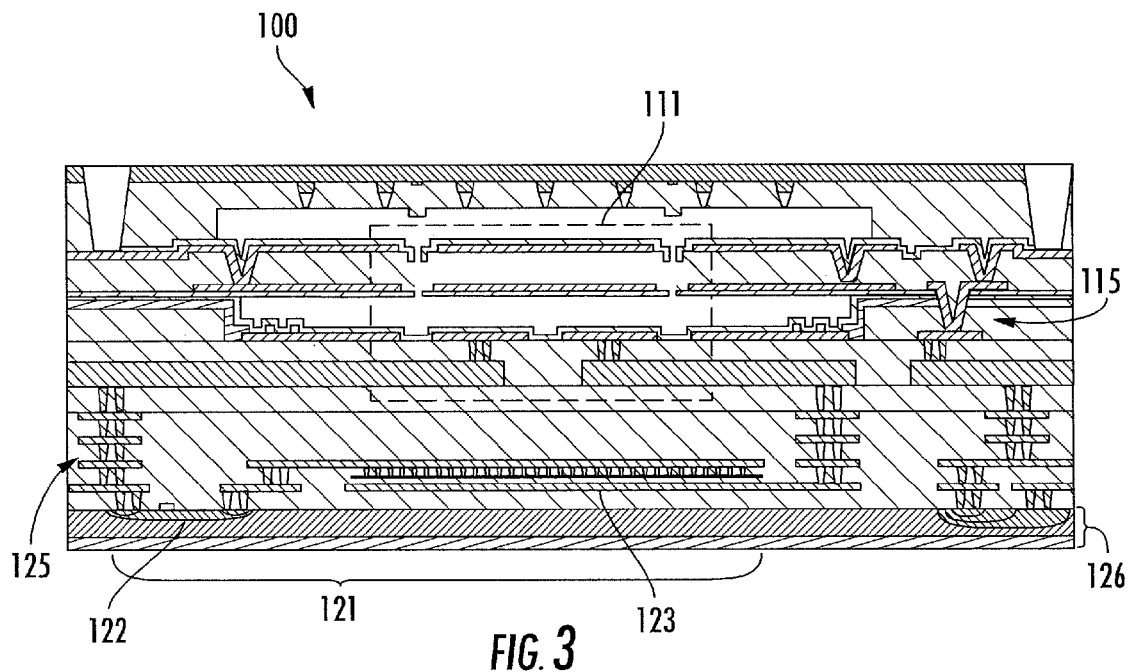
FIG. 3 is a sectional side view of a mixed-technology capacitor array according to an embodiment of the presently disclosed subject matter.

Further advantages of a combined system comprising multiple switching technologies can be realized by positioning the solid-state switches and associated capacitor elements directly above, below, or next to the MEMS capacitors, such as in a single monolithic semiconductor die, thereby forming a compact and efficient solution. As shown in FIG. 3, for example, a mixed-technology capacitor array, generally designated 100, can comprise one or more of solid-state-controlled elements 121 formed in a CMOS process. Each solid-state-controlled element 121 can comprise solid-state switch 122 (e.g., a MOS switch) and fixed capacitor 123 (e.g. a MIM fixed capacitor), which can be coupled to other elements in the array using a first interconnect 125. Alternatively, solid-state-controlled elements 121 can be built using SOI RF switches together with MIM capacitors or Mx-My capacitors using the back-end metals since the required capacitance values are so low.

Further referring to the configuration shown in FIG. 3, one or more of MEMS capacitors 111 can be implemented in interconnect layers above the CMOS and connected together to provide a combined variable capacitance. Specifically, for example, a second interconnect 115 can couple MEMS capacitor 111 to the rest of the array. A CMOS front-end 126 can further be provided to control the coupled elements. Although one possible configuration of such a mixed-technology capacitor array 100 is shown in FIG. 3, those having skill in the art will recognize that specific implementation of MEMS capacitor 111, solid-state switch 122, and fixed capacitor 123 can change while still adhering to the principles of a combined technology array disclosed herein.

Specifically, for example, although FIG. 3 shows one MEMS capacitor 111 positioned substantially directly above one fixed capacitor 123 (i.e., in a substantially one-for-one relationship), those having skill in the art will recognize that similarly beneficial performance can be achieved in other configurations in which such direct vertical alignment is not present. In particular, as long as first sub-array 110 is generally arranged in a different process layer from second sub-array 120, the advantages of a stacked arrangement can be realized even if each of MEMS capacitors 111 are not vertically aligned with one or more of solid-state-controlled elements 121. In one particular alternative configuration, for example, solid-state-controlled elements 121 can be positioned underneath a pad that lies between two of MEMS capacitors 111, while the CMOS under MEMS capacitors 111 can be configured to drive the respective MEMS components.

Figures 4A, 4B:
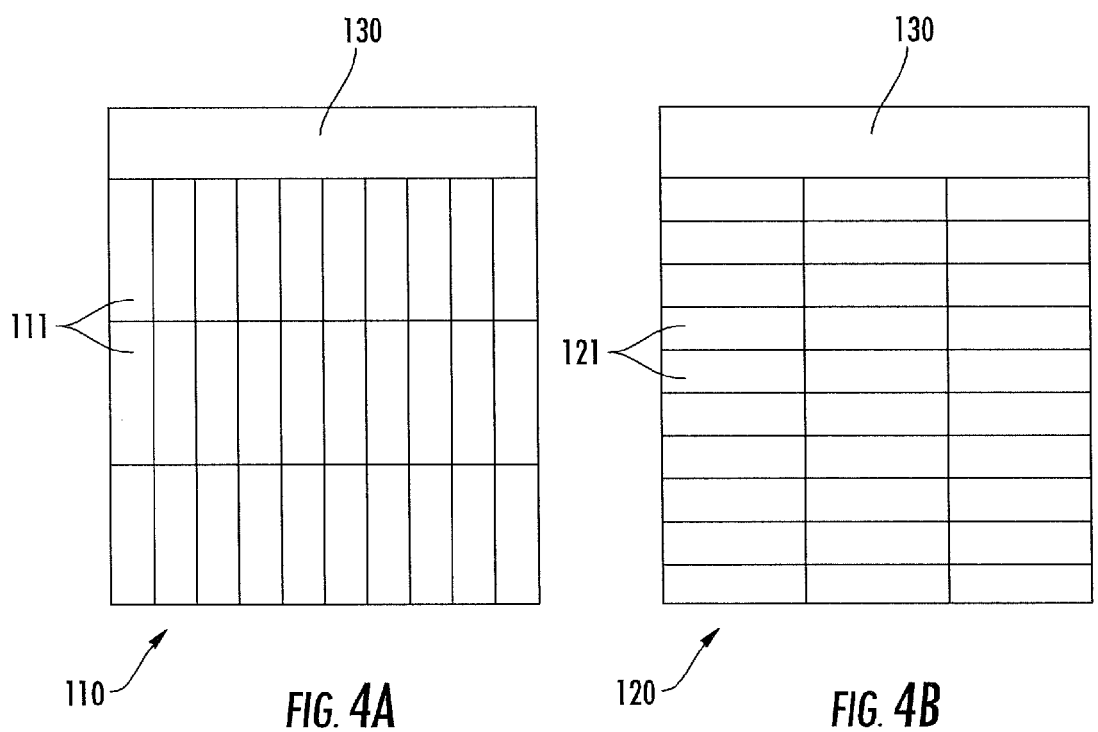
FIGS. 4A and 4B are plan views of sub-arrays of capacitive devices in a mixed-technology combination of tuning elements according to an embodiment of the presently disclosed subject matter.
Figure 4C:
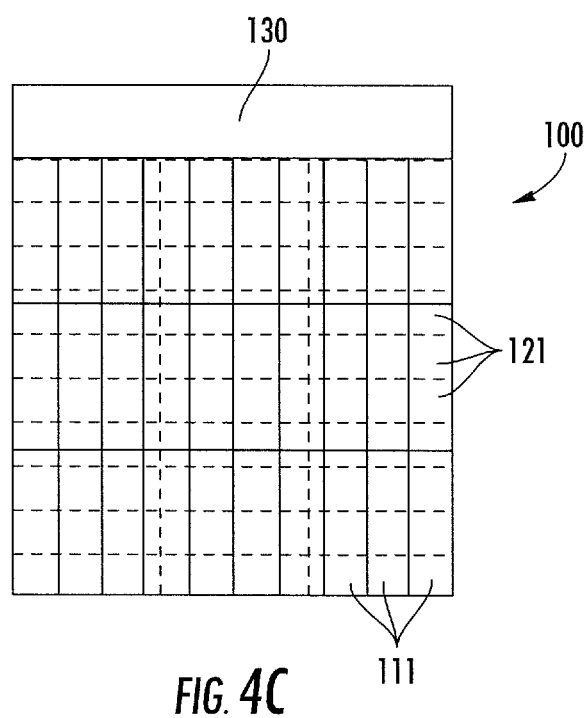
FIG. 4C is a plan view of a stacked arrangement of multiple sub-arrays of capacitive devices in a mixed-technology combination of tuning elements according to an embodiment of the presently disclosed subject matter.

In this regard, regardless of the specific implementation, by providing the solid-state devices and any associated fixed passives in an area substantially above or underneath the MEMS, the total die area can be substantially similar to that of the MEMS array alone. Specifically, as shown in FIGS. 4A through 4C, all of the elements of both first sub-array 110 and second sub-array 120 can be provided on one die with overlap to reuse the space and to provide intimate low parasitic and resistance connections between the two technologies. In particular, as shown in FIG. 4A, first sub-array 110 can comprise a plurality of MEMS capacitors 111 arranged in an area array configuration commonly used in the industry. Referring to FIG. 4B, second sub-array 120 can similarly comprise a plurality of solid-state-controlled elements 121 (e.g., which can each include solid-state switch 122 and fixed capacitor 123) laid out in an area array. As shown in FIG. 4C, the two arrays can be overlaid, such as in the configuration shown in FIG. 3. An array control system 130 can be coupled to an end of the stacked combination of first sub-array 110 and second sub-array 120. Although the individual elements are shown as all being approximately the same size for the sake of simplicity, those having ordinary skill in the art will recognize that the elements need not necessary each have a similar size.

Although the above discussion provides disclosure of particular, exemplary configurations in which a first sub-array 110 comprising one or more MEMS capacitors 111 is coupled with a second sub-array 120 comprising one or more solid-state-controlled elements 121, those having skill in the art should recognize that the principles of a mixed-technology programmable combination of tuning elements can be applied to a range of additional device configurations. Specifically, for example, rather than a plurality of MEMS capacitors 111, first sub-array can comprise a single MEMS capacitor beam (i.e., not an array of individual capacitors), and second sub-array 120 can comprise a switched element or an array of switched elements connected thereto for controlling the capacitance shift of the system.

The principles discussed herein can further be extended beyond purely capacitive devices to other component designs. Specifically, for example, solid-state-controlled elements 121 can be designed to comprise a printed inductor connected with a switch rather than a capacitive element. In such a configuration, solid-state-controlled elements 121 can function as a digitally switched high-Q inductor, and it could be integrated on the same insulating substrate as one or more switchable capacitors (e.g., one or more MEMS capacitors 111). As a result, the combined system can provide an array of tuning elements, including both switchable capacitors and switchable inductors.

Further in this regard, second sub-array 120 is discussed above as comprising one or more switchable capacitors or switches connected to fixed capacitors. In another aspect, however, second sub-array 120 can comprise one or more very low-loss bypass switches without any capacitors connected. In such a configuration, second sub-array 120 can operate as one or more ohmic switches, which can be used as a bypass or to implement a switchable inductor as discussed above.

The present subject matter can be embodied in other forms without departure from the spirit and essential characteristics thereof. The embodiments described therefore are to be considered in all respects as illustrative and not restrictive. Although the present subject matter has been described in terms of certain preferred embodiments, other embodiments that are apparent to those of ordinary skill in the art are also within the scope of the present subject matter.

What is claimed is:

1. A programmable combination of tuning elements comprising:
    one or more solid-state devices configured to deliver a first variable reactance; and
    one or more micro-electro-mechanical (MEMS) devices configured to deliver a second variable reactance;
    wherein the first variable reactance of the one or more solid-state devices and the second variable reactance of the one or more MEMS devices deliver a combined variable reactance; and
    wherein the one or more solid-state devices and the one or more MEMS devices are arranged in a single monolithic semiconductor die.

2. The programmable combination of tuning elements of claim 1, wherein the one or more solid-state devices are positioned beneath or above the one or more MEMS devices.

3. The programmable combination of tuning elements of claim 1, wherein the one or more MEMS devices are formed in interconnect layers above or beneath the one or more solid-state devices.

4. The programmable combination of tuning elements of claim 1, wherein the combined variable reactance comprises a combined variable capacitance.

5. The programmable combination of tuning elements of claim 4, wherein the one or more solid-state devices comprise one or more switches coupled to one or more fixed-state capacitors.

6. The programmable combination of tuning elements of claim 5, wherein the one or more switches comprise complementary metal-oxide-semiconductor (CMOS) switches.

7. The programmable combination of tuning elements of claim 5, wherein the one or more switches comprise silicon on insulator (SOI) or silicon on sapphire (SOS) switches.

8. The programmable combination of tuning elements of claim 5, wherein each of the one of the one or more fixed-state capacitors comprises a metal-insulator-metal (MIM) capacitor or multi-layer generalization of a MIM capacitor.

9. The programmable combination of tuning elements of claim 4, wherein each of the one or more solid-state devices provides a capacitance tuning range that is less than a capacitance range of each of the one or more MEMS devices.

10. The programmable combination of tuning elements of claim 9, wherein each of the one or more MEMS devices provides a capacitance tuning range of about 0.25 pF; and
    wherein each of the one or more solid-state devices provides a capacitance tuning range of about 0.125 pF or less.

11. The programmable combination of tuning elements of claim 9, wherein the one or more solid-state devices comprise a plurality of solid-state devices having different capacitance tuning ranges.

12. The programmable combination of tuning elements of claim 9, wherein each of the one or more MEMS devices provides a first predetermined capacitance tuning range; and wherein each of the one or more solid-state devices provides a capacitance tuning range less than or equal to about one-half (½) of the first predetermined capacitance tuning range.

13. The programmable combination of tuning elements of claim 12, wherein the one or more solid-state devices define a binary set of capacitances, wherein each capacitor i of the one or more solid-state devices provides a capacitance tuning range of about ½"(i+1) of the first predetermined capacitance range.

14. A method for producing a programmable combination of tuning elements, the method comprising:
producing one or more solid-state devices configured to deliver a first variable reactance; and
mounting one or more micro-electro-mechanical (MEMS) devices on top of, below, or beside the one or more solid-state devices in a single monolithic semiconductor die, the one or more MEMS devices configured to deliver a second variable reactance;
wherein the first variable reactance of the one or more solid-state devices and the second variable reactance of the one or more MEMS devices deliver a combined variable reactance.

15. The method of claim 14, wherein producing one or more solid-state devices comprises producing one or more switches coupled to one or more fixed state capacitors.

16. The method of claim 15, wherein producing one or more switches comprises producing complementary metal-oxide-semiconductor (CMOS) switches.

17. The method of claim 15, wherein producing one or more switches comprises producing silicon on insulator (SOI) or silicon on sapphire (SOS) switches.

18. The method of claim 15, wherein producing one or more fixed state capacitors comprises producing metal-insulator-metal (MIM) capacitors or multi-layer generalizations of a MIM capacitor.

19. The method of claim 15, wherein mounting one or more micro-electro-mechanical (MEMS) devices comprises forming the one or more MEMS devices in interconnect layers above or beneath the one or more solid-state devices.

20. A method for producing a programmable combination of tuning elements, the method comprising:
producing one or more solid-state devices configured to deliver a first variable reactance and one or more MEMS devices configured to deliver a second variable reactance in a single monolithic semiconductor die;
wherein the first variable reactance of the one or more solid-state devices and the second variable reactance of the one or more MEMS devices deliver a combined variable reactance.

* * * * *